United States Patent
Shimizu et al.

(10) Patent No.: US 12,424,437 B2
(45) Date of Patent: *Sep. 23, 2025

(54) PROCESSING METHOD, METHOD OF MANUFACTURING SEMICONDUCTOR DEVICE, PROCESSING APPARATUS, AND RECORDING MEDIUM

(71) Applicant: Kokusai Electric Corporation, Tokyo (JP)

(72) Inventors: Tomiyuki Shimizu, Toyama (JP); Masaya Nagato, Toyama (JP); Takashi Ozaki, Toyama (JP); Yoshitomo Hashimoto, Toyama (JP); Katsuyoshi Harada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/411,176

(22) Filed: Jan. 12, 2024

(65) Prior Publication Data

US 2024/0153758 A1 May 9, 2024

Related U.S. Application Data

(63) Continuation of application No. 17/468,338, filed on Sep. 7, 2021, now Pat. No. 11,961,733.

(30) Foreign Application Priority Data

Sep. 24, 2020 (JP) .................................. 2020-159426

(51) Int. Cl.
*H01L 21/02* (2006.01)
*C23C 16/40* (2006.01)
(Continued)

(52) U.S. Cl.
CPC .......... *H01L 21/022* (2013.01); *C23C 16/401* (2013.01); *C23C 16/45529* (2013.01);
(Continued)

(58) Field of Classification Search
CPC ............ H01L 21/022; H01L 21/02164; H01L 21/0228; C23C 16/401; C23C 16/45529; C23C 16/45544; C23C 16/52
(Continued)

(56) References Cited

U.S. PATENT DOCUMENTS 11,961,733 B2 * 4/2024 Shimizu ............ H01L 21/02175
2010/0105192 A1 4/2010 Akae et al.
(Continued)

FOREIGN PATENT DOCUMENTS

JP 2003-017685 A 1/2003
JP 2008-135633 A 6/2008
(Continued)

OTHER PUBLICATIONS

Korean Office Action issued on Feb. 20, 2024 for Korean Patent Application No. 10-2021-0118287.
(Continued)

*Primary Examiner* — Jasmine J Clark
(74) *Attorney, Agent, or Firm* — Volpe Koenig

(57) ABSTRACT

There is included forming an oxide film on a substrate by alternately performing: forming the first oxide film containing an atom X by performing a first cycle including non-simultaneously performing forming a first layer including a component in which a first functional group is bonded to the atom X, and forming a second layer containing the atom X and oxygen by oxidizing the first layer; and forming the second oxide film containing the atom X by performing a second cycle including non-simultaneously performing forming a third layer including a component in which the
(Continued)

first functional group is bonded to the atom X, and forming a fourth layer containing the atom X and oxygen by oxidizing the third layer, under a processing condition that an oxidizing power is higher than an oxidizing power when oxidizing the first layer.

23 Claims, 5 Drawing Sheets

(51) Int. Cl.
  *C23C 16/455* (2006.01)
  *C23C 16/52* (2006.01)
(52) U.S. Cl.
  CPC ........ *C23C 16/45544* (2013.01); *C23C 16/52* (2013.01); *H01L 21/02164* (2013.01); *H01L 21/0228* (2013.01); *H01L 21/02211* (2013.01)
(58) Field of Classification Search
  USPC ........................................................ 438/763
  See application file for complete search history.

(56) References Cited

U.S. PATENT DOCUMENTS

| | | |
|---|---|---|
| 2010/0291763 A1 | 11/2010 | Ogawa et al. |
| 2013/0295779 A1 | 11/2013 | Chandra et al. |
| 2015/0194302 A1 | 7/2015 | Akae et al. |
| 2016/0071720 A1 | 3/2016 | Nitta et al. |
| 2022/0223608 A1 | 7/2022 | Consiglio et al. |

FOREIGN PATENT DOCUMENTS

| | | |
|---|---|---|
| JP | 2010-153776 A | 7/2010 |
| JP | 2016-058489 A | 4/2016 |
| KR | 10-2016-0030058 A | 3/2016 |
| WO | 2017/136945 A1 | 8/2017 |

OTHER PUBLICATIONS

Maurice L. Huggins, "Bond Energies and Polarities". Journal of the American Chemical Society. Sep. 1953, vol. 75, p. 4125.
Japanese Office Action issued on Jun. 13, 2023 for Japanese Patent Application No. 2022-127071.
Singapore Search Report issued on Oct. 13, 2022 for Singapore Patent Application No. 10202109788W.
Singapore Written Opinion issued on Oct. 13, 2022 for Singapore Patent Application No. 10202109788W.
Chinese Office Action issued on Oct. 26, 2024 for Chinese Patent Application No. 202110945727.7.

* cited by examiner

PROCESSING METHOD, METHOD OF MANUFACTURING SEMICONDUCTOR DEVICE, PROCESSING APPARATUS, AND RECORDING MEDIUM

CROSS-REFERENCE TO RELATED APPLICATIONS

This application is a continuation of U.S. patent application Ser. No. 17/468,338, filed Sep. 7, 2021, now U.S. Pat. No. 11,961,733, which is based upon and claims the benefit of priority from Japanese Patent Application No. 2020-159426, filed on Sep. 24, 2020, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

As one of processes for manufacturing a semiconductor device, there may be performed a substrate-processing process in which an oxide film is formed on a substrate by alternately repeating a step of supplying a precursor to the substrate and a step of supplying an oxidizing agent to the substrate.

SUMMARY

Some embodiments of the present disclosure provide a technique capable of improving the characteristics of an oxide film formed on a substrate.

According to one or more embodiments of the present disclosure, there is provided a technique that includes forming an oxide film in which a first oxide film and a second oxide film are alternately laminated on a substrate by alternately performing, a predetermined number of times: (a) forming the first oxide film containing an atom X by performing a first cycle $n_1$ times ($n_1$ is an integer of 1 or more), the first cycle including non-simultaneously performing (a1) forming a first layer including a component in which a first functional group is bonded to the atom X by supplying a precursor, which includes a partial structure in which the first functional group and a second functional group are directly bonded to the atom X and has a bonding energy between the first functional group and the atom X higher than a bonding energy between the second functional group and the atom X, to the substrate, and (a2) forming a second layer containing the atom X and oxygen by supplying a first oxidizing agent to the substrate to oxidize the first layer; and (b) forming the second oxide film containing the atom X by performing a second cycle $n_2$ times ($n_2$ is an integer of 1 or more), the second cycle including non-simultaneously performing (b1) forming a third layer including a component in which the first functional group is bonded to the atom X by supplying the precursor to the substrate, and (b2) forming a fourth layer containing the atom X and oxygen by supplying a second oxidizing agent to the substrate to oxidize the third layer, under a processing condition that an oxidizing power is higher than an oxidizing power when oxidizing the first layer in (a2).

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Hereinafter, one or more embodiments of the present disclosure will be described mainly with reference to FIGS. 1 to 6. The drawings used in the following description are all schematic. On the drawings, the dimensional relationship of each element, the ratio of each element, and the like do not always match the actual ones. Further, even between the drawings, the dimensional relationship of each element, the ratio of each element, and the like do not always match.

(1) Configuration of Substrate Processing Apparatus

Figure 1:
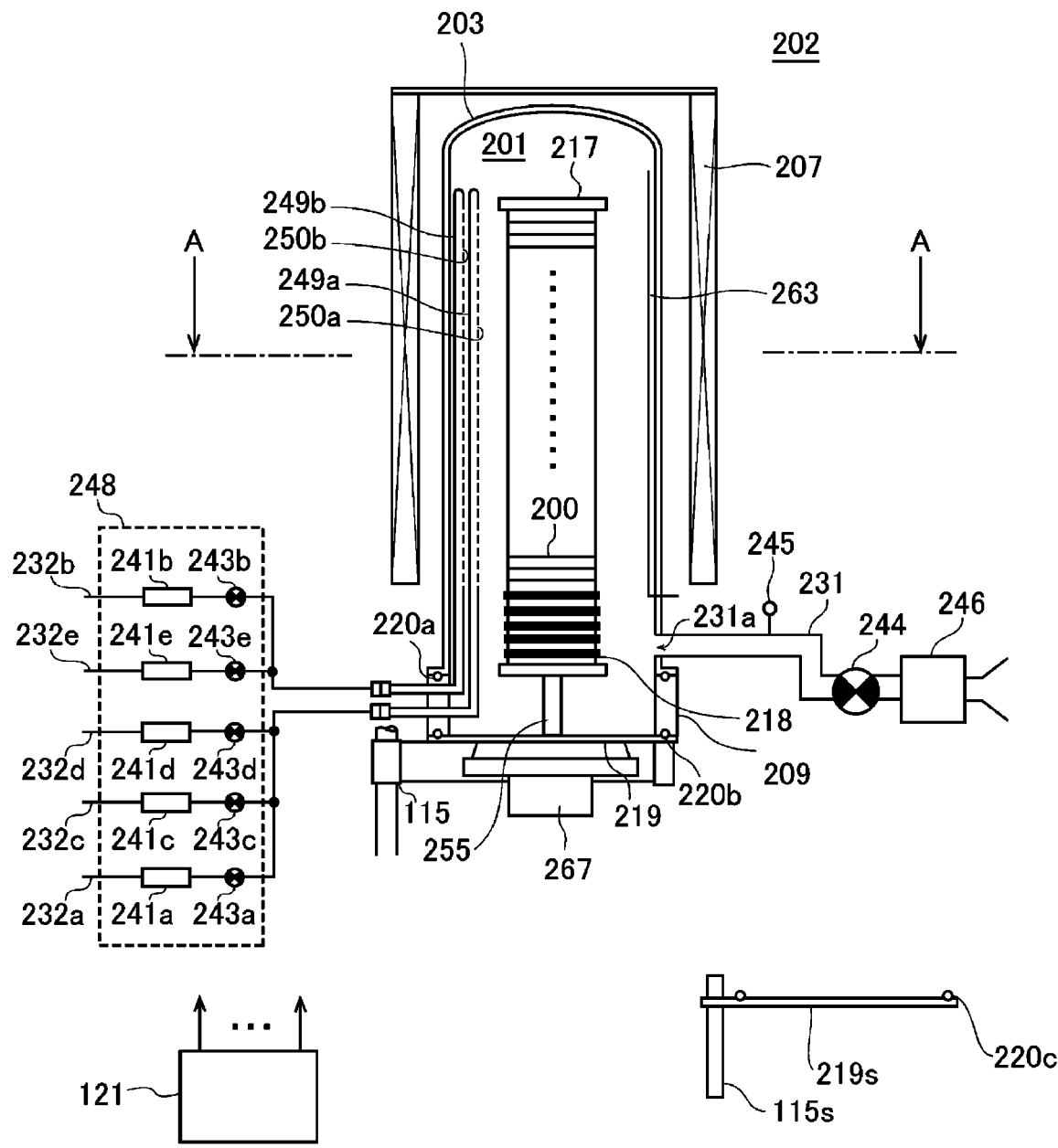
FIG. 1 is a schematic configuration diagram of a vertical process furnace of a substrate processing apparatus suitably used in one or more embodiments of the present disclosure, in which the portion of the process furnace 202 is illustrated in a vertical sectional view.

As shown in FIG. 1, a process furnace 202 includes a heater 207 as a heating mechanism (temperature adjustment part). The heater 207 has a cylindrical shape and is vertically installed by being supported by a holding plate. The heater 207 also functions as an activation mechanism (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC), and is formed in a cylindrical shape with an upper end thereof closed and a lower end thereof opened. Below the reaction tube 203, a manifold 209 is arranged concentrically with the reaction tube 203. The manifold 209 is made of a metallic material such as stainless steel (SUS) or the like, and is formed in a cylindrical shape with upper and lower ends thereof opened. The upper end of the manifold 209 is engaged with the lower end of the reaction tube 203 and is configured to support the reaction tube 203. An O-ring 220a as a seal member is installed between the manifold 209 and the reaction tube 203. The reaction tube 203 is installed vertically in the same manner as the heater 207. A process container (reaction container) mainly includes the reaction tube 203 and the manifold 209. A process chamber 201 is formed in the hollow portion of the process container. The process chamber 201 is configured to accommodate wafers 200 as substrates. The process to wafers 200 is performed in the process chamber 201.

Nozzles 249a and 249b as a first supply part and a second supply part are installed in the process chamber 201 so as to penetrate the side wall of the manifold 209. The nozzles 249a and 249b are also referred to as a first nozzle and a second nozzle, respectively. The nozzles 249a and 249b are respectively made of a non-metallic material such as quartz or SiC, which is a heat-resistant material. Gas supply pipes 232a and 232b as a first pipe and a second pipe are connected to the nozzles 249a and 249b, respectively. The nozzles 249a and 249b are installed adjacent to each other.

Mass flow controllers (MFC) 241a and 241b as flow rate controllers (flow rate control parts) and valves 243a and 243b as opening/closing valves are installed in the gas supply pipes 232a and 232b, respectively, sequentially from the upstream side of a gas flow. Gas supply pipes 232c and 232d are connected to the gas supply pipe 232a on the downstream side of the valve 243a. MFCs 241c and 241d and valves 243c and 243d are installed in the gas supply pipes 232c and 232d, respectively, sequentially from the upstream side of a gas flow. A gas supply pipe 232e is connected to the gas supply pipe 232b on the downstream side of the valve 243b. An MFC 241e and a valve 243e are installed in the gas supply pipe 232e sequentially from the upstream side of the gas flow. The gas supply pipes 232a to 232e are made of a metallic material such as stainless steel or the like.

Figure 2:
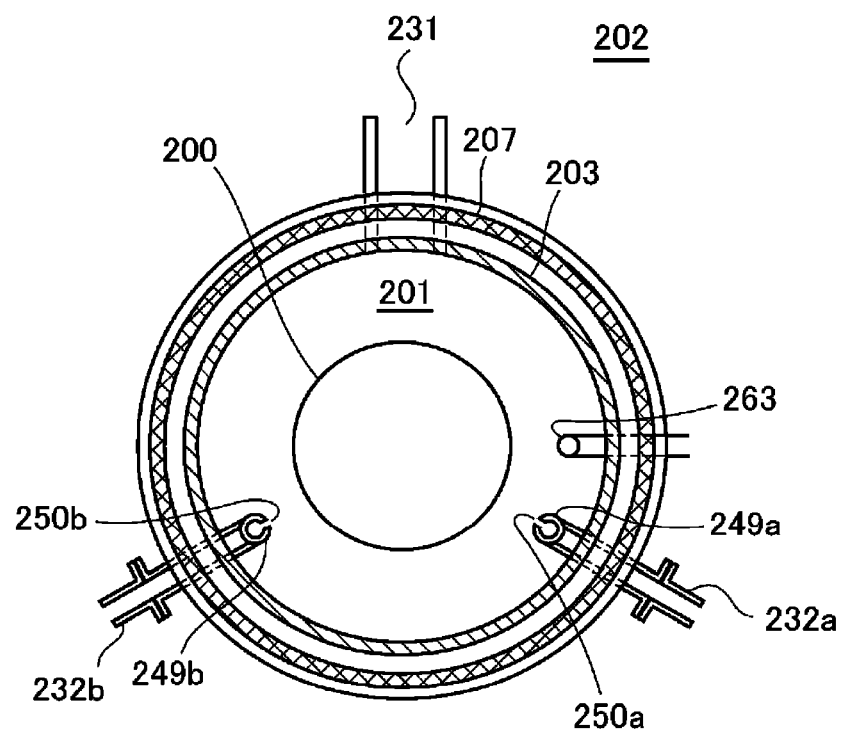
FIG. 2 is a schematic configuration diagram of the vertical process furnace of the substrate processing apparatus suitably used in one or more embodiments of the present disclosure, in which the portion of the process furnace 202 is illustrated in a sectional view taken along line A-A in FIG. 1.

As shown in FIG. 2, the nozzles 249a and 249b are arranged in a space having an annular shape in a plane view between the inner wall of the reaction tube 203 and the wafers 200 and are installed to extend upward in the arrangement direction of the wafers 200 from the lower portion to the upper portion of the inner wall of the reaction tube 203. In other words, the nozzles 249a and 249b are respectively installed in a region horizontally surrounding a wafer arrangement region, in which the wafers 200 are arranged, on the lateral side of the wafer arrangement region so as to extend along the wafer arrangement region. Gas supply holes 250a and 250b for supplying gases are formed on the side surfaces of the nozzles 249a and 249b, respectively. The gas supply holes 250a and 250b are respectively opened so as to face the centers of the wafers 200 in a plane view and can supply gases toward the wafers 200. The gas supply holes 250a and 250b are formed in plural number from the lower portion to the upper portion of the reaction tube 203.

From the gas supply pipe 232a, a precursor (precursor gas) is supplied into the process chamber 201 via the MFC 241a, the valve 243a, and the nozzle 249a. The precursor gas is a precursor in a gaseous state, for example, a gas obtained by vaporizing a precursor kept in a liquid state under the room temperature and the atmospheric pressure, a precursor kept in a gaseous state under the room temperature and the atmospheric pressure, and the like. In the subject specification, for the sake of convenience, the precursor gas may be simply referred to as precursor.

From the gas supply pipe 232b, an oxygen (O)-containing gas as an oxidizing agent (oxidizing gas) is supplied into the process chamber 201 via the MFC 241b, the valve 243b, and the nozzle 249b. The O-containing gas acts as an oxidizing gas, i.e., an O source.

From the gas supply pipe 232c, a hydrogen (H)-containing gas as a reducing agent (reducing gas) is supplied into the process chamber 201 via the MFC 241c, the valve 243c, the gas supply pipe 232a, and the nozzle 249a. The H-containing gas alone does not have an oxidizing action. In the substrate-processing process described later, the H-containing gas reacts with the O-containing gas under specific conditions to generate an oxidizing species such as atomic oxygen (O) or the like, and acts to improve the efficiency of an oxidizing process. Therefore, the H-containing gas may be considered to be included in the oxidizing agent.

From the gas supply pipes 232d and 232e, an inert gas is supplied into the process chamber 201 via the MFCs 241d and 241e, the valves 243d and 243e, the gas supply pipes 232a and 232b, and the nozzles 249a and 249b, respectively. The inert gas acts as a purge gas, a carrier gas, a dilution gas, and the like.

A precursor supply system, i.e., a precursor gas supply system, mainly includes the gas supply pipe 232a, the MFC 241a, and the valve 243a. An oxidizing agent supply system (first oxidizing agent supply system and second oxidizing agent supply system), i.e., an oxidizing gas supply system (O-containing gas supply system), mainly includes the gas supply pipe 232b, the MFC 241b, and the valve 243b. A reducing agent supply system, i.e., a reducing gas supply system (H-containing gas supply system), includes the gas supply pipe 232c, the MFC 241c, and the valve 243c. The gas supply pipe 232c, the MFC 241c, and the valve 243c may be included in the oxidizing agent supply system. An inert gas supply system mainly includes the gas supply pipes 232d and 232e, the MFCs 241d and 241e, and the valves 243d and 243e.

Each or both of the precursor and the oxidizing agent may also be referred to as a film-forming gas, and each or both of the precursor supply system and the oxidizing agent supply system may also be referred to as a film-forming gas supply system.

Some or all of the above-described various supply systems may be configured as an integrated supply system 248 in which the valves 243a to 243e, the MFCs 241a to 241e, and the like are integrated. The integrated supply system 248 is connected to each of the gas supply pipes 232a to 232e and is configured so that the operations of supplying various gases into the gas supply pipes 232a to 232e, i.e., the opening and closing operations of the valves 243a to 243e, the flow rate adjustment operation by the MFCs 241a to 241e, and the like are controlled by the controller 121 which will be described later. The integrated supply system 248 is formed of integral type or a division type integrated units and may be attached to and detached from the gas supply pipes 232a to 232e and the like on an integrated unit basis. The integrated supply system 248 is configured so that the maintenance, replacement, expansion, and the like of the integrated supply system 248 can be performed on an integrated unit basis.

An exhaust port 231a for exhausting the atmosphere in the process chamber 201 is installed in the lower portion of the side wall of the reaction tube 203. The exhaust port 231a may be installed to extend from the lower portion to the upper portion of the side wall of the reaction tube 203, i.e., along the wafer arrangement region. An exhaust pipe 231 is connected to the exhaust port 231a. The exhaust pipe 231 is made of a metallic material such as stainless steel or the like. A vacuum pump 246 as an evacuation device is connected to the exhaust pipe 231 via a pressure sensor 245 as a pressure detector (pressure detection part) for detecting the pressure in the process chamber 201 and an APC (Auto Pressure Controller) valve 244 as a pressure regulator (pressure regulation part). The APC valve 244 is configured so that it can perform or stop vacuum evacuation of the interior of the process chamber 201 by being opened and closed in a state in which the vacuum pump 246 is operated. Furthermore, the APC valve 244 is configured so that it can regulate the pressure in the process chamber 201 by adjusting the valve opening degree based on the pressure information detected by the pressure sensor 245 in a state in which the vacuum pump 246 is operated. An exhaust system mainly includes the exhaust pipe 231, the APC valve 244, and the pressure sensor 245. The vacuum pump 246 may be considered to be included in the exhaust system.

A seal cap 219 as a furnace opening lid capable of airtightly closing the lower end opening of the manifold 209 is installed below the manifold 209. The seal cap 219 is made of a metallic material such as, for example, stainless steel or the like, and is formed in a disc shape. On the upper surface of the seal cap 219, there is installed an O-ring 220b as a seal member that comes into contact with the lower end of the manifold 209. Below the seal cap 219, there is installed a rotation mechanism 267 for rotating a boat 217 to be described later. A rotating shaft 255 of the rotation mechanism 267 is made of, for example, a metallic material such as stainless steel or the like and is connected to the boat 217 via the seal cap 219. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer system (transfer mechanism) that loads and unloads (transfers) the wafers 200 into and out of the process chamber 201 by raising and lowering the seal cap 219.

Below the manifold 209, a shutter 219s is installed as a furnace opening lid capable of airtightly closing the lower end opening of the manifold 209 in a state in which the seal cap 219 is lowered and the boat 217 is unloaded from the process chamber 201. The shutter 219s is made of a metallic material such as stainless steel or the like and is formed in a disk shape. An O-ring 220c as a seal member that comes into contact with the lower end of the manifold 209 is installed on the upper surface of the shutter 219s. The opening/closing operations (the elevating operation, the rotating operation, and the like) of the shutter 219s are controlled by a shutter-opening/closing mechanism 115s.

The boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another, i.e., to arrange the wafers 200 at intervals. The boat 217 is made of a heat-resistant material such as, for example, quartz or SiC. Heat-insulating plates 218 made of a heat-resistant material such as, for example, quartz or SiC, are supported in multiple stages at the bottom of the boat 217.

Inside the reaction tube 203, there is installed a temperature sensor 263 as a temperature detector. By adjusting the degree of supplying electric power to the heater 207 based on the temperature information detected by the temperature sensor 263, the temperature in the process chamber 201 becomes a desired temperature distribution. The temperature sensor 263 is installed along the inner wall of the reaction tube 203.

Figure 3:
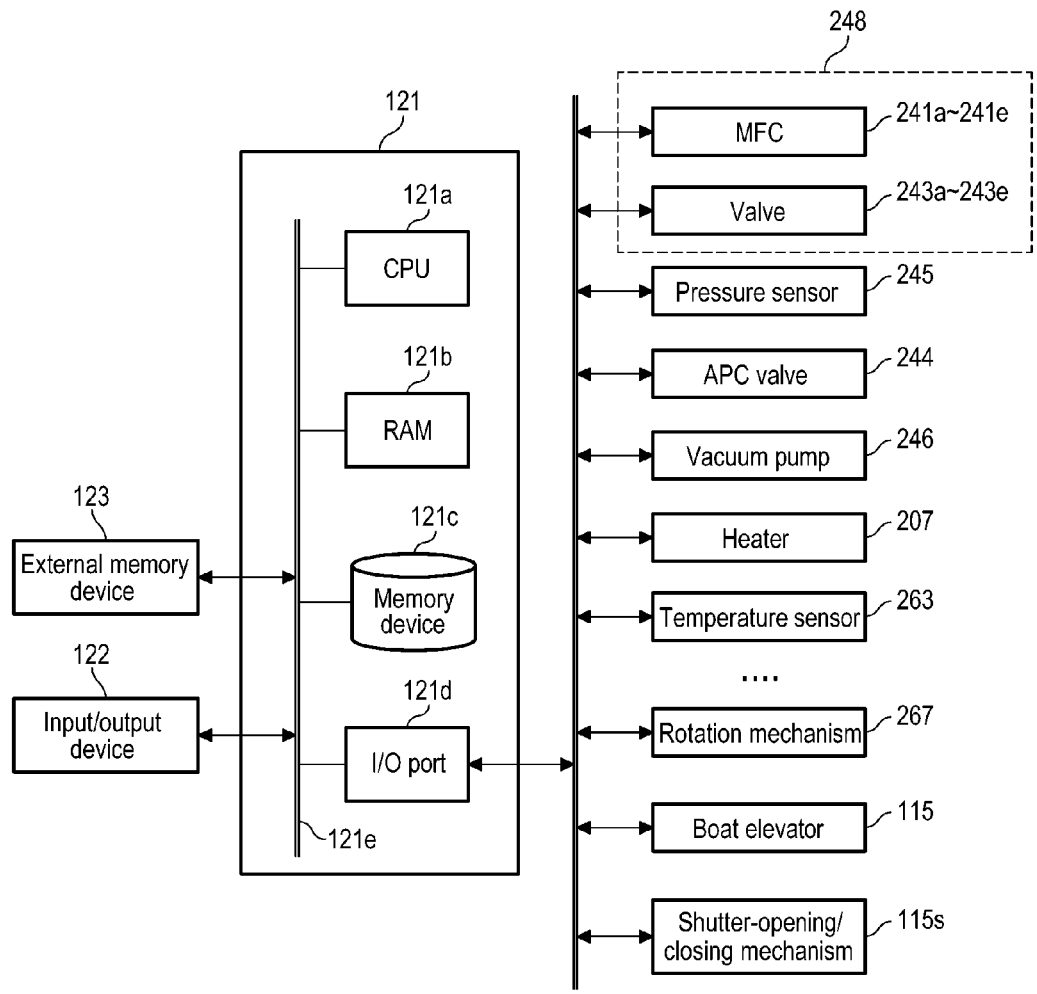
FIG. 3 is a schematic configuration diagram of a controller of the substrate processing apparatus suitably used in one or more embodiments of the present disclosure, in which a control system of the controller 121 is illustrated in a block diagram.

As shown in FIG. 3, the controller 121 as a control part (control means) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, a HDD (Hard Disk Drive), a SSD (Solid State Drive), or the like. In the memory device 121c, there are readably stored a control program for controlling the operation of the substrate processing apparatus, a process recipe in which procedures and conditions of substrate processing to be described later are written, and the like. The process recipe is a combination for causing the controller 121 to execute the respective procedures in a below-described substrate-processing process so as to obtain a predetermined result. The process recipe functions as a program. Hereinafter, the control program, the process recipe, and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data, and the like read by the CPU 121a are temporarily held.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter-opening/closing mechanism 115s, and the like.

The CPU 121a is configured to read and execute the control program from the memory device 121c and to read the recipe from the memory device 121c in response to an input of an operation command from the input/output device 122 or the like. The CPU 121a is configured to, according to the contents of the recipe thus read, control the flow rate adjustment operation of various gases by the MFCs 241a to 241e, the opening/closing operations of the valves 243a to 243e, the opening/closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotation mechanism 267, the raising and lowering operation of the boat 217 by the boat elevator 115, the opening/closing operation of the shutter 219s by the shutter-opening/closing mechanism 115s, and the like.

The controller 121 may be configured by installing, in the computer, the above-described program stored in an external memory device 123. The external memory device 123 includes, for example, a magnetic disk such as a HDD or the like, an optical disk such as a CD or the like, a magneto-optical disk such as a MO or the like, a semiconductor memory such as a USB memory, a SSD or the like, and so forth. The memory device 121c and the external memory device 123 are configured as a non-transitory computer-readable recording medium. Hereinafter, the memory device 121c and the external memory device 123 are collectively and simply referred to as a recording medium. As used herein, the term "recording medium" may include only the memory device 121c, only the external memory device 123, or both. The provision of the program to the computer may be performed by using a communication means such as the Internet or a dedicated line without using the external memory device 123.

(2) Substrate-Processing Process

As one of processes of manufacturing a semiconductor device using the substrate processing apparatus described above, an example of a sequence in which a process to a wafer 200 as a substrate is performed, i.e., an example of a film-forming sequence in which an oxide film is formed on the wafer 200, will be described mainly with reference to FIGS. 4 to 6. In the following description, the operations of the respective parts constituting the substrate processing apparatus are controlled by the controller 121.

In the film-forming sequence according to these embodiments, an oxide film (laminated oxide film) in which a first oxide film and a second oxide film are alternately laminated, is formed on the wafer 200 by alternately performing, a predetermined number of times:

step A of forming the first oxide film containing an atom X by performing a first cycle $n_1$ times ($n_1$ is an integer of 1 or more), the first cycle including non-simultaneously performing step a1 of forming a first layer including a component in which a first functional group is bonded to the atom X by supplying a precursor gas, which includes a partial structure in which the first functional group and a second functional group are directly bonded to the atom X and has a bonding energy between the first functional group and the atom X higher than a bonding energy between the second functional group and the atom X, to the wafer 200, and step a2 of forming a second layer containing the atom X and O by supplying a first oxidizing agent to the wafer 200 to oxidize the first layer; and step B of forming the second oxide film containing the atom X by performing a second cycle $n_2$ times ($n_2$ is an integer of 1 or more), the second cycle including non-simultaneously performing step b1 of forming a third layer including a component in which the first functional group is bonded to the atom X by supplying the precursor gas to the wafer 200, and step b2 of forming a fourth layer containing the atom X and O by supplying a second oxidizing agent to the wafer 200, under a processing condition that an oxidizing power is higher than an oxidizing power when oxidizing the first layer in step a2, to oxidize the third layer.

Hereinafter, a case where the atom X includes, for example, silicon (Si) will be described. In this case, for example, an O-containing gas may be used as the first oxidizing agent. For example, an O-containing gas and a H-containing gas may be used as the second oxidizing agent. In this case, a layer including a component in which the first functional group is bonded to Si is formed as the first layer, a layer containing Si and O is formed as the second layer, a layer including a component in which the first functional group is bonded to Si is formed as the third layer, and a layer containing Si and O is formed as the fourth layer. Further, in this case, a film containing Si and O, i.e., a first silicon oxide film (first SiO film) is formed as the first oxide film, and a film containing Si and O, i.e., a silicon oxide film (second SiO film) is formed as the second oxide film. Finally, a SiO film (laminated SiO film) in which the first SiO film and the second SiO film are alternately laminated is formed on the wafer 200. Hereinafter, this example will be described in detail.

Figure 4:
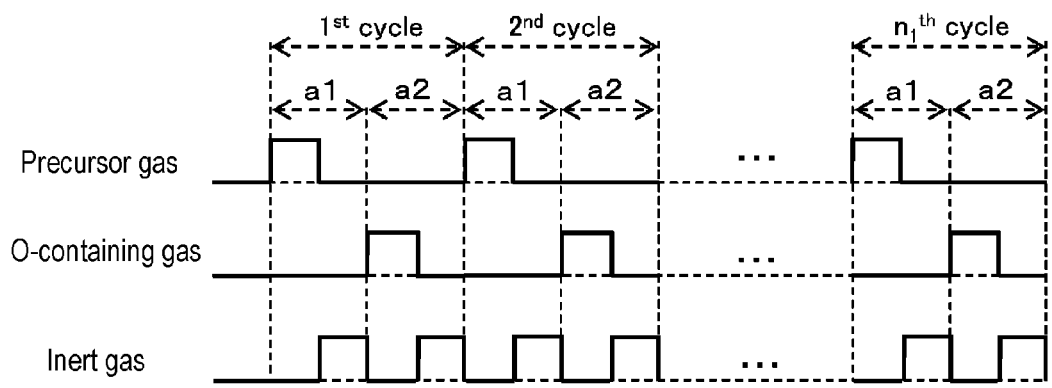
FIG. 4 is a flowchart showing a gas supply sequence when forming a first oxide film in one or more embodiments of the present disclosure.
Figure 5:
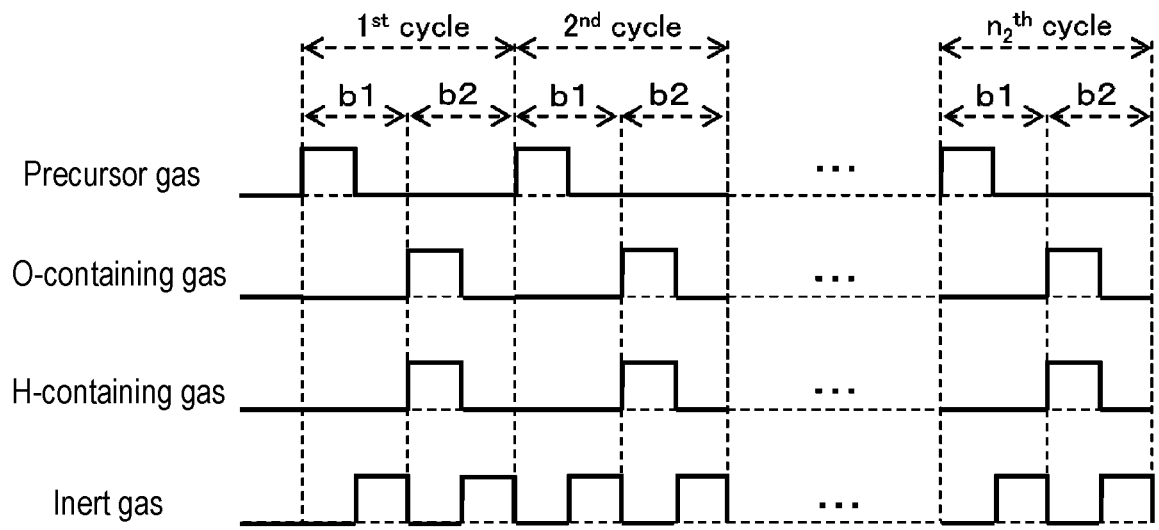
FIG. 5 is a flowchart showing a gas supply sequence when forming a second oxide film in one or more embodiments of the present disclosure.

FIG. 4 shows a film-forming sequence (gas supply sequence) when forming the first SiO film, and FIG. 5 shows a film-forming sequence (gas supply sequence) when forming the second SiO film. In FIG. 4, a1 indicates step a1, and a2 indicates step a2. In FIG. 5, b1 indicates step b1, and b2 indicates step b2.

In the subject specification, the above-described film-forming sequence may be denoted as follows for the sake of convenience. The same notation is used in the following description of modifications and other embodiments.

$$(\text{precursor gas} \to \text{O-containing gas}) \times n_1 \to (\text{precursor gas} \to \text{O-containing gas} + \text{H-containing gas}) \times n_2 \to \ldots$$

When the set in which step A and step B are performed non-simultaneously is performed a predetermined number of times ($n_3$ times where $n_3$ is an integer of 1 or more), the above-described film-forming sequence may be denoted as follows for the sake of convenience. In this example, step A is performed first, and step B is performed lastly.

$$[(\text{precursor gas} \to \text{O-containing gas}) \times n_1 \to (\text{precursor gas} \to \text{O-containing gas} + \text{H-containing gas}) \times n_2] \times n_3$$

Further, when step A is performed after performing, a predetermined number of times ($n_3$ times where $n_3$ is an integer of 1 or more), the set in which step A and step B are performed non-simultaneously, the above-described film-forming sequence may be denoted as follows for the sake of convenience. In this example, step A is performed first and lastly.

$$[(\text{precursor gas} \to \text{O-containing gas}) \times n_1 \to (\text{precursor gas} \to \text{O-containing gas} + \text{H-containing gas}) \times n_2] \times n_3 \to (\text{precursor gas} \to \text{O-containing gas}) \times n_1$$

Further, when the set in which step B and step A are performed non-simultaneously is performed a predetermined number of times ($n_3$ times where $n_3$ is an integer of 1 or more), the above-described film-forming sequence may be denoted as follows for the sake of convenience. In this example, step B is performed first, and step A is performed lastly.

$$[(\text{precursor gas} \to \text{O-containing gas} + \text{H-containing gas}) \times n_2 \to (\text{precursor gas} \to \text{O-containing gas}) \times n_1] \times n_3$$

Further, when step A is performed after performing, a predetermined number of times ($n_3$ times where $n_3$ is an integer of 1 or more), the set in which step B and step A are performed non-simultaneously, the above-described film-forming sequence may be denoted as follows for the sake of convenience. In this example, step B is performed first and lastly.

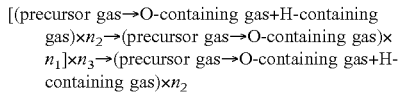

In these cases, when step A is performed a plurality of times, $n_1$ in step A performed a plurality of times may be the same or different. When step B is performed a plurality of times, $n_2$ in step B performed a plurality of times may be the same or different.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

(Wafer Charging and Boat Loading)

When a plurality of wafers 200 is charged to the boat 217 (wafer charging), the shutter 219s is moved by the shutter-opening/closing mechanism 115s to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b.

(Pressure Regulation and Temperature Adjustment)

After the boat loading is completed, the inside of the process chamber 201, i.e., the space where the wafer 200 exists, is evacuated into vacuum (evacuated into a reduced pressure) by the vacuum pump 246 so that the pressure inside the process chamber 201 becomes a desired pressure (degree of vacuum). At this time, the pressure in the process chamber 201 is measured by the pressure sensor 245, and the APC valve 244 is subjected to feedback control based on the measured pressure information (pressure regulation). Furthermore, the wafer 200 in the process chamber 201 is heated by the heater 207 so that the wafer 200 has a desired processing temperature. At this time, the degree of supplying electric power to the heater 207 is feedback-controlled based on the temperature information detected by the temperature sensor 263 so that the inside of the process chamber 201 has a desired temperature distribution (temperature adjustment). Moreover, the rotation of the wafer 200 by the rotation mechanism 267 is started. The evacuation of the process chamber 201 and the heating and rotation of the wafer 200 are continuously performed at least until the process to the wafer 200 is completed.

The surface of the wafer 200 is terminated (OH-terminated) by a hydroxyl group (—OH). That is, a OH termination is formed on the surface of the wafer 200. The OH termination existing on the surface of the wafer 200 has a function as an adsorption site for molecules and atoms that constitute the precursor gas used in these embodiments.

(Laminated Oxide Film Formation)

Thereafter, step A of forming a first SiO film and step B of forming a second SiO film are alternately performed a predetermined number of times in a predetermined order.

[Step A]

In step A, the following steps a1 and a2 are sequentially performed.

[Step a1]

In this step, a precursor gas is supplied to the wafer 200 in the process chamber 201.

Specifically, the valve 243a is opened to allow the precursor gas to flow into the gas supply pipe 232a. The flow rate of the precursor gas is adjusted by the MFC 241a. The precursor gas is supplied into the process chamber 201 via the nozzle 249a, and is exhausted from the exhaust port 231a. At this time, the precursor gas is supplied to the wafer 200 (precursor gas supply). At this time, the valves 243d and 243e may be opened to supply an inert gas into the process chamber 201 via the nozzles 249a and 249b.

In this step, the precursor gas is supplied under a condition that a first functional group is not desorbed and a second functional group is desorbed from Si as an atom X contained in the precursor gas, and under a condition that Si having a state in which the first functional group is bonded thereto and the second functional group is desorbed therefrom is adsorbed to the surface of the wafer 200. When a gas in which a first functional group is bonded to each of three bonds of four bonds of Si and a second functional group is bonded to the remaining one bond of the four bonds of Si is used as the precursor gas, in this step, the precursor gas is supplied under a processing condition that Si is adsorbed to the surface of the wafer 200 in a state in which the first functional group is bonded to each of the three bonds of Si. The bonding energy $E_O$ between the first functional group and Si is higher than the bonding energy $E_A$ between the second functional group and Si. That is, the second functional group has an active property of being easily desorbed from Si as compared with the first functional group.

By performing this step under such a processing condition, it is possible to desorb the second functional group, without desorbing the first functional group, from Si contained in the precursor gas. Further, Si having a state in which the first functional group is bonded thereto and the second functional group is desorbed therefrom can be caused to be adsorbed (chemically adsorbed) to the surface of the wafer 200. As a result, for example, Si can be adsorbed to a part of the adsorption sites on the surface of the wafer 200 in a state in which the first functional groups are bonded to three bonds of the four bonds of Si. In this way, a first layer including a component in which the first functional group is bonded to Si can be formed on the outermost surface of the wafer 200. Further, the outermost surface of the first layer can be terminated with a chemically stable first functional group.

Further, in this step, the precursor gas is supplied under a condition that the adsorption of Si, which has a state in which the first functional group is bonded thereto and the second functional group is desorbed therefrom, to the surface of the wafer 200 is more dominant (predominant) than the adsorption of the second functional group, which is desorbed from Si, to the surface of the wafer 200.

By performing this step under such a processing condition, it is possible to suppress the adsorption of the second functional group, which is desorbed from Si contained in the precursor gas, to the surface of the wafer 200, and it is possible to prevent the second functional group from being adsorbed to the surface of the wafer 200. As a result, it is possible to suppress the mixing of the second functional group, which is desorbed from Si contained in the precursor gas, into the first layer formed on the wafer 200, and it is possible to prevent the second functional group from being contained in the first layer. That is, the first layer formed on the wafer 200 can be formed as a layer having a low content of the second functional group and a small amount of impurities derived from the second functional group, such as carbon (C) and nitrogen (N). Further, the outermost surface of the first layer can be terminated with a chemically stable first functional group.

Further, in this step, by the first functional groups bonded to Si adsorbed to the surface of the wafer 200, i.e., by allowing the bonds of Si adsorbed to the surface of the wafer 200 to be filled (closed) with the first functional groups, it is possible to inhibit the adsorption of at least one selected from the group of an atom and a molecule to Si adsorbed to the surface of the wafer 200. Further, in this step, by allowing the first functional groups bonded to Si adsorbed to the surface of the wafer 200 to act as a steric hindrance, it is possible to inhibit the adsorption of at least one selected from the group of an atom and a molecule to the adsorption site (OH termination) on the surface of the wafer 200 that is located in a vicinity of Si adsorbed to the surface of the wafer 200. As a result, it is possible to improve the in-plane thickness uniformity and the step coverage of the first layer formed on the wafer 200.

Further, in this step, the first functional group bonded to Si adsorbed to the surface of the wafer 200 makes it possible to hold the adsorption sites (OH terminations) on the surface of the wafer 200 that is located in a vicinity of the first functional group. Further, in this step, Si can be discontinuously adsorbed to the surface of the wafer 200. That is, in this step, Si can be adsorbed to the surface of the wafer 200 so as to have a thickness of less than one atomic layer. As a result, it is possible to improve the in-plane thickness uniformity and the step coverage of the first layer formed on the wafer 200.

In this step, it is preferable to continuously supply the precursor gas until the adsorption reaction (chemical adsorption reaction) of Si on the surface of the wafer 200 is saturated. Even if the supply of the precursor gas is continued in this way, Si can be discontinuously adsorbed to the surface of the wafer 200 by allowing the first functional group bonded to Si to act as a steric hindrance. This makes it possible to improve the in-plane thickness uniformity and the step coverage of the first layer formed on the wafer 200.

In a state in which the adsorption reaction of Si on the surface of the wafer 200 is saturated, the first layer composed of Si adsorbed to the surface of the wafer 200 has a thickness of less than one atomic layer. That is, in a state in which the adsorption reaction of Si on the surface of the wafer 200 is saturated, the first layer composed of Si adsorbed to the surface of the wafer 200 becomes a discontinuous layer. This makes it possible to improve the in-plane thickness uniformity and the step coverage of the first layer formed on the wafer 200.

Further, in a state in which the adsorption reaction of Si on the surface of the wafer 200 is saturated, a part of the surface of the wafer 200 is held without consuming the adsorption sites (OH terminations). This makes it possible to improve the in-plane thickness uniformity and the step coverage of the first layer formed on the wafer 200.

Further, in a state in which the adsorption reaction of Si on the surface of the wafer 200 is saturated, the surface of the wafer 200 is covered with the first functional group bonded to Si. This makes it possible to improve the in-plane thickness uniformity and the step coverage of the first layer formed on the wafer 200.

After the first layer is formed, the valve 243a is closed to stop the supply of the precursor gas into the process chamber 201. Then, the inside of the process chamber 201 is evacuated to remove the gas or the like remaining in the process chamber 201 from the inside of the process chamber 201 (purging). At this time, the valves 243d and 243e are opened to supply an inert gas into the process chamber 201. The inert gas acts as a purge gas.

As the precursor gas, it is preferable to use a precursor gas including a partial structure in which the first functional group and the second functional group are directly bonded to Si as an atom X with a bonding energy $E_O$ between the first functional group and Si as the atom X higher than a bonding energy $E_A$ between the second functional group and Si as the atom X. The first functional group may include a third functional group.

The first functional group includes, for example, an alkoxy group. The alkoxy group has a structure in which an alkyl group (R) as a third functional group is bonded to an oxygen (O) atom, and is a monovalent functional group represented by a structural formula of —OR. The alkoxy group (—OR) includes a methoxy group (—OMe), an ethoxy group (—OEt), a propoxy group (—OPr), a butoxy group (—OBu), and the like. The alkoxy group may be not only these linear alkoxy groups but also branched alkoxy groups such as an isopropoxy group, an isobutoxy group, a secondary butoxy group, and a tertiary butoxy group. Further, the alkyl group (—R) as the third functional group described above includes a methyl group (-Me), an ethyl group (-Et), a propyl group (—Pr), a butyl group (-Bu), and the like. The alkyl group may be not only these linear alkyl groups but also branched alkyl groups such as an isopropyl group, an isobutyl group, a secondary butyl group, and a tertiary butyl group.

The second functional group includes, for example, an amino group. The amino group has a structure in which hydrogen (H) is removed from any of ammonia ($NH_3$), primary amine, and secondary amine, and is a monovalent functional group represented by a structural formula of —$NH_2$, —NHR, or —NRR'. R and R' shown in the structural formula are alkyl groups including a methyl group, an ethyl group, a propyl group, a butyl group, and the like. R and R' may be not only these linear alkyl groups but also branched alkyl groups such as an isopropyl group, an isobutyl group, a secondary butyl group, and a tertiary butyl group. R and R' may be the same alkyl group or different alkyl groups. Examples of the amino group may include a dimethylamino group (—$N(CH_3)_2$) and a diethylamino group (—$N(C_2H_5)_2$).

The bonding energy $E_O$ between an alkoxy group such as a methoxy group, an ethoxy group, a propoxy group or a butoxy group and Si is higher than the bonding energy $E_A$ between an amino group and Si. That is, the amino group has an active property of being easily desorbed from Si as compared with the alkoxy group.

Examples of the precursor gas may include a trimethoxy (dimethylamino)silane ($[(CH_3)_2N]Si(OCH_3)_3$, abbreviation: TMDMAS) gas, a triethoxy(diethylamino)silane ($[(C_2H_5)_2N]Si(OC_2H_5)_3$, abbreviation: TEDEAS) gas, a triethoxy (dimethylamino)silane ($[(CH_3)_2N]Si(OC_2H_5)_3$, abbreviation: TEDMAS) gas, a trimethoxy(diethylamino)silane ($[(C_2H_5)_2N]Si(OCH_3)_3$, abbreviation: TMDEAS) gas, and the like. Si contained in these precursors has four bonds. Alkoxy groups (methoxy groups and ethoxy groups) as first functional groups are bonded to three bonds of the four bonds of Si. An amino group (dimethylamino group or diethylamino group) as a second functional group is bonded to the remaining one bond of the four bonds of Si. The ratio of the number of amino groups and the number of alkoxy groups included in these precursors is 1:3. As the precursor gas, one or more of them may be used.

The precursor gas is not limited to the above-described gases. Various gases having a similar structure, i.e., a partial structure in which a first functional group and a second functional group are directly bonded to Si as an atom X (central atom) may be suitably used as the precursor gas as long as they are gases in which the bonding energy $E_O$ between the first functional group and Si is higher than the bonding energy $E_N$ between the second functional group and Si. That is, as the precursor gas, it may be possible to suitably use various gases which have a partial structure in which a first functional group and a second functional group are directly bonded to Si as an atom X (central atom) and which includes an alkoxy group as the first functional group and includes at least one selected from the group of an amino group, an alkyl group, a halogeno group, a hydroxy group, a hydro group, an aryl group, a vinyl group, and a nitro group as the second functional group. In this regard, the alkyl group includes a methyl group, an ethyl group, a propyl group, a butyl group, and the like. Further, the halogeno group includes a chloro group, a fluoro group, a bromo group, an iodine group, and the like. That is, the halogeno group includes halogen elements such as chlorine (Cl), fluorine (F), bromine (Br), and iodine (I).

As the inert gas, it may be possible to use, for example, a rare gas such as a nitrogen ($N_2$) gas, an argon (Ar) gas, a helium (He) gas, a neon (Ne) gas, a xenon (Xe) gas, or the like. One or more of them may be used as the inert gas. This point holds in a similar manner as in each step described later.

[Step a2]

After step a1 is completed, an O-containing gas is supplied as a first oxidizing agent to the wafer 200 in the process chamber 201, i.e., the first layer formed on the wafer 200.

Specifically, the valve 243b is opened to allow the O-containing gas to flow into the gas supply pipe 232b. The flow rate of the O-containing gas is adjusted by the MFC 241b. The O-containing gas is supplied into the process chamber 201 via the nozzle 249b, and is exhausted from the exhaust port 231a. At this time, the O-containing gas is supplied to the wafer 200 (O-containing gas supply). At this time, the valves 243d and 243e may be opened to supply an inert gas into the process chamber 201 via the nozzles 249a and 249b.

In this step, the O-containing gas is supplied under a processing condition that at least one selected from the group of the third functional group included in the first functional group bonded to Si contained in the first layer and the first functional group bonded to Si is desorbed.

By performing this step under such a processing condition, at least one selected from the group of the third functional group (including residue thereof) included in the first functional group bonded to Si contained in the first layer and the first functional group (including residue thereof) bonded to Si can be desorbed from the first layer. At least a part of the first layer formed on the wafer 200 can be oxidized (modified) to form a silicon oxide layer (SiO layer) containing Si and O as the second layer. The second layer is a layer in which the content of impurities due to the third functional group, the first functional group, and the residue thereof is smaller than that of the first layer, i.e., a layer in which the content of impurities such as C and H is smaller than that of the first layer. Further, as a result of the oxidizing process with the O-containing gas, the surface of the second layer comes into an OH-terminated state, i.e., a state in which an adsorption site is formed. Impurities such as C and H desorbed from the first layer form a gaseous substance containing C and H, and are discharged from the process chamber 201.

After the second layer is formed, the valve 243b is closed to stop the supply of the O-containing gas into the process chamber 201. Then, by the same processing procedure as the purging performed in step a1, the gas or the like remaining in the process chamber 201 is removed from the inside of the process chamber 201 (purging).

As the first oxidizing agent, i.e., the O-containing gas, it may be possible to use, for example, an oxygen ($O_2$) gas, a nitrogen monoxide (NO) gas, a nitrous oxide ($N_2O$) gas, a nitrogen dioxide ($NO_2$) gas, a carbon monoxide (CO) gas, a carbon dioxide ($CO_2$) gas, and the like. One or more of them may be used as the first oxidizing agent.

[Performed a Predetermined Number of Times]

By performing a cycle a predetermined number of times ($n_1$ times where $n_1$ is an integer of 1 or more), the cycle including non-simultaneously, i.e., without synchronization, performing the above-described steps a1 and a2, a first SiO film having a predetermined composition and a predetermined film thickness can be formed on the wafer 200. The above-described cycle is preferably repeated a plurality of times. That is, the thickness of the second layer formed by performing the above cycle once is set to be smaller than a desired film thickness, and the above-described cycle is preferably repeated a plurality of times until the film thickness of the first SiO film formed by laminating the second layers one above another reaches the desired film thickness. The thickness of the first SiO film may be, for example, 0.1 nm or more and 5 nm or less, preferably 0.5 nm or more and 3 nm or less.

The first SiO film is superior to the below-described second SiO film in the in-plane film thickness uniformity and the step coverage, and also has the property capable of maintaining the base oxidization amount in a good state. The reason for the first SiO film being superior to the second SiO film in the in-plane film thickness uniformity and the step coverage is that in step a2, the first layer is oxidized under the processing condition that the oxidizing power is weaker (lower) than in step b2, which will be described later. Specifically, the reason is that in step a2, the O-containing gas is used alone as the first oxidizing agent, i.e., that the gas which is less likely to be deactivated in a shorter time than the second oxidizing agent used in below-described step b2 is used. In this case, in step a2, the O-containing gas and the first layer can be uniformly reacted with each other both in the peripheral portion and the central portion of the wafer 200. As a result, the first SiO film can be formed as a film having excellent in-plane film thickness uniformity and step overage. Further, the reason for the base oxidization amount being maintained in a better state when forming the first SiO film than when forming the second SiO film is that in step a2, the first layer is oxidized under the processing condition that the oxidizing power is weaker than in below-described step b2. Specifically, the reason is that in step a2, the gas having a weaker oxidizing power than the second oxidizing agent used in below-described step b2 is used as the first oxidizing agent. In this case, it is possible to sufficiently suppress the oxidizing of the base, i.e., the oxidizing of the surface of the wafer 200 in contact with the first SiO film.

[Step B]

In step B, the following steps b1 and b2 are sequentially performed.

[Step b1]

The processing procedure and the processing condition in this step are the same as the processing procedure and the processing condition of step a1 described above.

That is, in this step, the precursor gas is supplied under a condition that a first functional group is not desorbed and a second functional group is desorbed from Si as an atom X contained in the precursor gas, and under a condition that Si having a state in which the first functional group is bonded thereto and the second functional group is desorbed therefrom is adsorbed to the surface of the wafer 200. When a gas in which a first functional group is bonded to each of three bonds of four bonds of Si and a second functional group is bonded to the remaining one bond of the four bonds of Si is used as the precursor gas, in this step, the precursor gas is supplied under a processing condition that Si is adsorbed to the surface of the wafer 200 in a state in which the first functional group is bonded to each of the three bonds of Si. By performing this step under such a processing condition, a third layer including a component in which the first functional group is bonded to Si can be formed on the outermost surface of the wafer 200. Further, the outermost surface of the third layer can be terminated with a chemically stable first functional group.

Further, in this step, the precursor gas is supplied under a condition that the adsorption of Si, which has a state in which the first functional group is bonded thereto and the second functional group is desorbed therefrom, to the surface of the wafer 200 is more dominant (predominant) than the adsorption of the second functional group, which is desorbed from Si, to the surface of the wafer 200. By performing this step under such a processing condition, the third layer can be formed as a layer having a low content of the second functional group and a small amount of impurities derived from the second functional group, such as C and N. Further, the outermost surface of the third layer can be terminated with a chemically stable first functional group.

Further, in this step, as a similar manner as in step a1, the first functional group bonded to Si adsorbed to the surface of wafer 200 makes it possible to inhibit the adsorption of at least one selected from the group of an atom and a molecule to Si adsorbed to the surface of the wafer 200. Moreover, it is possible to inhibit the adsorption of at least one selected from the group of an atom and a molecule to the adsorption site (OH termination) on the surface of the wafer 200 that is located in a vicinity of Si adsorbed to the surface of the wafer 200. As a result, it is possible to improve the in-plane thickness uniformity and the step coverage of the third layer formed on the wafer 200.

Further, in this step, as a similar manner as in step a1, the first functional group bonded to Si adsorbed to the surface of the wafer 200 makes it possible to hold the adsorption sites (OH terminations) on the surface of the wafer 200 that is located in a vicinity of the first functional group. Further, in this step, Si can be discontinuously adsorbed to the surface of the wafer 200. That is, in this step, Si can be adsorbed to the surface of the wafer 200 so as to have a thickness of less than one atomic layer. As a result, it is possible to improve the in-plane thickness uniformity and the step coverage of the third layer formed on the wafer 200.

In this step, as a similar manner as in step a1, it is preferable to continuously supply the precursor gas until the adsorption reaction (chemical adsorption reaction) of Si on the surface of the wafer 200 is saturated. Even if the supply of the precursor gas is continued in this way, Si can be discontinuously adsorbed to the surface of the wafer 200. This makes it possible to improve the in-plane thickness uniformity and the step coverage of the third layer formed on the wafer 200.

In a state in which the adsorption reaction of Si on the surface of the wafer 200 is saturated, the third layer composed of Si adsorbed to the surface of the wafer 200 becomes a discontinuous layer having a thickness of less than one atomic layer. This makes it possible to improve the in-plane thickness uniformity and the step coverage of the third layer formed on the wafer 200.

Further, in a state in which the adsorption reaction of Si on the surface of the wafer 200 is saturated, a part of the surface of the wafer 200 is held without consuming the adsorption sites (OH terminations). This makes it possible to improve the in-plane thickness uniformity and the step coverage of the third layer formed on the wafer 200.

Further, in a state in which the adsorption reaction of Si on the surface of the wafer 200 is saturated, the surface of the wafer 200 is covered with the first functional group bonded to Si. This makes it possible to improve the in-plane thickness uniformity and the step coverage of the third layer formed on the wafer 200.

After the third layer is formed, the valve 243a is closed to stop the supply of the precursor gas into the process chamber 201. Then, by the same processing procedure as the purging performed in step a1, the gas or the like remaining in the process chamber 201 is removed from the process chamber 201 (purging).

As the precursor gas, various precursor gases exemplified in step a1 may be used.

[Step b2]

After step b1 is completed, an O-containing gas and a H-containing gas are supplied to the wafer 200 in the process chamber 201, i.e., the third layer formed on the wafer 200.

Specifically, the valves 243b and 243c are opened, to allow the O-containing gas and the H-containing gas to flow into the gas supply pipes 232b and 232c, respectively. The flow rates of the O-containing gas and the H-containing gas flowing through the gas supply pipes 232b and 232c are adjusted by the MFCs 241b and 241c, respectively. The O-containing gas and the H-containing gas are supplied into the process chamber 201 via the nozzles 249b and 249a. The O-containing gas and the H-containing gas are mixed and reacted in the process chamber 201, and are then exhausted from the exhaust port 231a. At this time, a water ($H_2O$)-free oxidizing species containing oxygen such as atomic oxygen (O) generated by the reaction of the O-containing gas and the H-containing gas is supplied to the wafer 200 (O-containing gas and H-containing gas supply). At this time, the valves 243d and 243e may be opened to supply an inert gas into the process chamber 201 via the nozzles 249a and 249b.

In this step, the O-containing gas and the H-containing gas are supplied under a processing condition that the third functional group included in the first functional group bonded to Si contained in the third layer and the first functional group bonded to Si are desorbed.

By performing this step under such a processing condition, the third functional group (including residue thereof) included in the first functional group bonded to Si contained in the third layer and the first functional group (including residue thereof) bonded to Si can be desorbed from the third layer. At least a part of the third layer formed on the wafer 200 can be oxidized (modified) to form a silicon oxide layer (SiO layer) containing Si and O as a fourth layer. The fourth layer is a layer in which the content of impurities due to the third functional group, the first functional group and the residues thereof is smaller than that of the third layer, i.e., a layer in which the content of impurities such as C and H is smaller than that of the third layer. Further, as a result of the oxidizing process with the O-containing gas and the H-containing gas, the surface of the fourth layer comes into a OH-terminated state, i.e., a state in which an adsorption site is formed. Impurities such as C and H desorbed from the third layer form a gaseous substance containing C and H, and are discharged from the process chamber 201.

In this step, the third layer can be oxidized under a processing condition that the oxidizing power is higher (stronger) than in step a2. Specifically, in this step, by using the oxidizing species such as atomic oxygen and the like, the oxidizing power when oxidizing the third layer can be made higher than the oxidizing power when oxidizing the first layer in step a2. As a result, in step b2, it is possible to promote the desorption of the third functional group (including the residue thereof) included in the first functional group bonded to Si contained in the third layer and the desorption of the first functional group (including the residue thereof) bonded to Si. Further, when the third layer includes a second functional group (including the residue thereof), it is possible to promote the desorption of the second functional group. As a result, the fourth layer can be formed as a layer including fewer impurities such as C, H, and N than the second layer.

After the fourth layer is formed, the valves 243b and 243c are closed to stop the supply of the O-containing gas and the H-containing gas into the process chamber 201. Then, by the same processing procedure as the purging in step a1, the gas or the like remaining in the process chamber 201 is removed from the process chamber 201 (purging).

As the second oxidizing agent, i.e., as the O-containing gas+H-containing gas, it may be possible to use, for example, $O_2$ gas+hydrogen ($H_2$) gas, ozone ($O_3$) gas+$H_2$ gas, hydrogen peroxide ($H_2O_2$) gas+$H_2$ gas, water vapor ($H_2O$ gas)+$H_2$ gas, or the like. In this case, as the H-containing gas, a deuterium ($2H_2$) gas may be used instead of the $H_2$ gas. In this specification, the parallel notation of two gases such as "$O_2$ gas+$H_2$ gas" means a mixed gas of the $H_2$ gas and the $O_2$ gas. When supplying a mixed gas, two gases may be mixed (premixed) in a supply pipe and then supplied into the process chamber 201, or two gases may be supplied separately from different supply pipes into the process chamber 201 and mixed (post-mixed) in the process chamber 201. As the second oxidizing agent, for example, an O-containing gas such as an $O_3$ gas, a $H_2O_2$ gas, a $H_2O$ gas, or a plasma-excited $O_2$ gas ($O_2^*$) may be used alone as a reactive gas, i.e., without adding the H-containing thereto. One or more of them may be used as the second oxidizing agent.

[Performed a Predetermined Number of Times]

By performing a cycle $n_2$ times ($n_2$ is an integer of 1 or more), the cycle including non-simultaneously, i.e., without synchronization, performing above-described steps b1 and b2, a second SiO film having a predetermined composition and a predetermined film thickness can be formed on the wafer 200. The above cycle is preferably repeated a plurality of times. That is, the thickness of the fourth layer formed by performing the above cycle once is set to be smaller than a desired film thickness, and the above-described cycle is preferably repeated a plurality of times until the film thickness of the second SiO film formed by laminating the fourth layers one above another reaches the desired film thickness. The thickness of the second SiO film may be, for example, 0.1 nm or more and 5 nm or less, preferably 0.5 nm or more and 3 nm or less.

The second SiO film is more excellent in processing resistance (wet etching resistance or the like which will be hereinafter simply referred to as etching resistance) than the above-described first SiO film. This is because the O-containing gas and the H-containing gas are used as the second oxidizing agent in step b2 and because the oxidizing power when oxidizing the third layer is higher than the oxidizing power when oxidizing the first layer in step a2. Thus, the second SiO film can be formed as a film including fewer impurities such as C, H, and N than the first SiO film. Further, the arrangement of the atoms constituting the second SiO film can be made uniform, the distance between the atoms constituting the second SiO film can be made shorter than the distance between the atoms constituting the first SiO film, and the bonding between the atoms constituting the second SiO film can be made stronger than the bonds between the atoms constituting the first SiO film. As a result, the molecular structure of the second SiO film can be brought closer to a more stable state than the molecular structure of the first SiO film. As a result, the second SiO film becomes a film having a better processing resistance than the first SiO film.

[Alternately Performing steps A and B]

Figure 6:
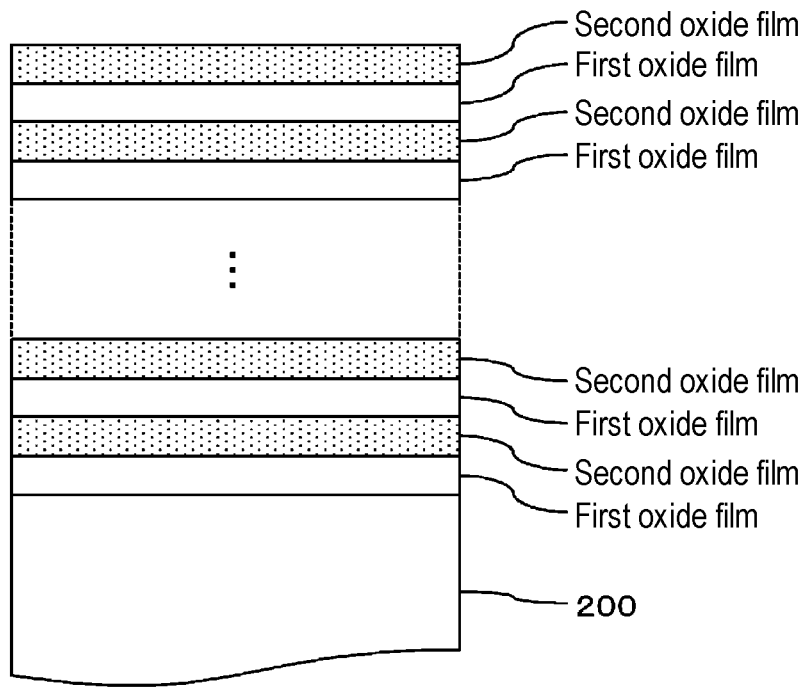
FIG. 6 is an enlarged partial sectional view of the surface of a wafer 200 having a laminated oxide film formed by alternately laminating a first oxide film and a second oxide film in one or more embodiments of the present disclosure.

By alternately performing above-described steps A and B a predetermined number of times in a predetermined order, as shown in FIG. 6, a SiO film (laminated SiO film) can be formed on the wafer 200 as an oxide film (laminated oxide film) obtained by alternately laminating the first SiO film and the second SiO film.

As described above, the first SiO film is superior to the second SiO film in the in-plane film thickness uniformity and the step coverage, and also has the property capable of maintaining the base oxidization amount in a good state. Further, the second SiO film is more excellent in processing resistance than the first SiO film. For these reasons, the laminated oxide film including a laminated structure of the first SiO film and the second SiO film becomes a film having these characteristics together, i.e., a film which is superior in the in-plane film thickness uniformity and the step coverage, has the property capable of maintaining the base oxidization amount in a good state, and is excellent in the processing resistance.

By setting the thickness of at least one selected from the group of the first SiO film and the second SiO film, preferably the thickness of both the first SiO film and the second SiO film to a thickness in a range of 0.1 nm or more and 5 nm or less, preferably 0.5 nm or more and 3 nm or less, more preferably 0.5 nm or more and 2 nm or less, even more preferably 0.5 nm or more and 1.5 nm or less, it is possible to form a laminated oxide film that appropriately combines the respective characteristics of the first SiO film and the second SiO film, i.e., the characteristics such as the superior in-plane film thickness uniformity, the superior step coverage, the excellent processing resistance, the base oxidization suppressing action, and the like.

As shown in FIG. 6, when forming the laminated oxide film, it is preferable that the first SiO film is first formed on the wafer 200 by first performing step A. Further, when forming the laminated oxide film, it is preferable that the second SiO film is formed lastly by performing step B lastly. That is, as shown in FIG. 6, it is preferable that the lowermost layer of the laminated oxide film is the first SiO film and the uppermost layer of the laminated oxide film is the second SiO film.

(Processing Condition)

Hereinafter, specific processing conditions in steps A and B will be described by way of example. In the following description, the notation of a numerical range such as "1 to 2666 Pa" means that the lower limit value and the upper limit value are included in the range. Therefore, for example, "1 to 2666 Pa" means "1 Pa or more and 2666 Pa or less." The same applies to other numerical ranges. Further, the processing temperature in the subject specification means the temperature of the wafer 200, and the processing pressure means the pressure in the process chamber 201. In addition, the gas supply flow rate "0 sccm" means a case where the gas is not supplied. These are also applied to the following description.

The processing conditions in step a1 are exemplified as follows.
  Precursor gas supply flow rate: 0.01 to 2 slm, preferably 0.1 to 1 slm
  Precursor gas supply time: 1 to 120 seconds, preferably 1 to 60 seconds
  Inert gas supply flow rate (for each gas supply pipe): 0 to 10 slm
  Processing temperature: 550 to 700 degrees C., preferably 600 to 650 degrees C.
  Processing pressure: 1 to 2666 Pa, preferably 67 to 1333 Pa The processing conditions in step a2 are exemplified as follows.
  O-containing gas supply flow rate: 0.1 to 10 slm
  O-containing gas supply time: 1 to 120 seconds, preferably 1 to 60 seconds
  Processing pressure: 1 to 4000 Pa, preferably 1 to 3000 Pa
  Other processing conditions may be the same as the processing conditions in step a1.

The processing conditions in step b1 are exemplified as follows.
  Precursor gas supply flow rate: 0.01 to 2 slm, preferably 0.1 to 1 slm
  Precursor gas supply time: 1 to 120 seconds, preferably 1 to 60 seconds
  Inert gas supply flow rate (for each gas supply pipe): 0 to 10 slm
  Processing temperature: 550 to 700 degrees C., preferably 600 to 650 degrees C.
  Processing pressure: 1 to 2666 Pa, preferably 67 to 1333 Pa The processing conditions in step b2 are exemplified as follows.
  O-containing gas supply flow rate: 0.1 to 10 slm
  H-containing gas supply flow rate: 0.1 to 10 slm
  Each gas supply time: 1 to 120 seconds, preferably 1 to 60 seconds
  Processing pressure: 1 to 2000 Pa, preferably 1 to 1333 Pa
  Other processing conditions may be the same as the processing conditions in step b1.

When the processing temperature is less than 550 degrees C., impurities such as C, H, and N derived from the first functional group, the second functional group, the third functional group, and the residues thereof are likely to remain in the first SiO film and the second SiO film formed on the wafer 200, and the processing resistance of the laminated oxide film formed on the wafer 200, i.e., the etching resistance may decrease. By setting the processing temperature to the temperature of 550 degrees C. or higher, it is possible for the high etching resistance of the second SiO film to compensate for the decrease in the etching resistance of the first SiO film, and the etching resistance of the entire laminated oxide film can be set to a practical level. By setting the processing temperature to 600 degrees C. or higher, it is possible to further enhance the effects set forth herein.

Further, when the processing temperature exceeds 700 degrees C., the in-plane film thickness uniformity and the step coverage of the entire laminated oxide film may deteriorate, and the base oxidization amount may become too large. Thus, the in-plane film thickness uniformity, the step coverage, and the base oxidization amount may fall below practical levels. By setting the processing temperature to 700 degrees C. or lower, it is possible for the high in-plane film thickness uniformity and the step coverage of the first SiO film to compensate for the decrease in the in-plane film thickness uniformity and the step coverage of the second SiO film, and it is possible to set the in-plane film thickness uniformity and the step coverage of the entire laminated oxide film to practical levels. In addition, the base oxidization amount can be set to a practical level. By setting the processing temperature to 650 degrees C. or lower, it is possible to enhance the effects set forth herein.

(After-Purging and Atmospheric Pressure Restoration)

After the laminated oxide film having a desired thickness is formed on the wafer 200, an inert gas as a purge gas is supplied into the process chamber 201 from each of the nozzles 249a and 249b, and is exhausted from the exhaust port 231a. As a result, the inside of the process chamber 201 is purged, and the gas, reaction by-products, and the like remaining in the process chamber 201 are removed from the inside of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter closing). The processed wafers 200 are discharged out of the boat 217 after being unloaded from the reaction tube 203 (wafer discharging).

(3) Effect of these Embodiments

According to these embodiments, one or more of the following effects may be obtained.

(a) In step A, it is possible to form the first SiO film having better in-plane film thickness uniformity and step coverage than the second SiO film while maintaining a good base oxidization amount. Further, in step B, it is possible to form the second SiO film having better processing resistance than the first SiO film. In these embodiments, by alternately performing these steps a predetermined number of times, the laminated oxide film formed on the wafer 200 can be provided as a film having superior in-plane film thickness uniformity, step coverage, and processing resistance while maintaining the base oxidization amount in a good state.

(b) In steps a1 and b1, the outermost surfaces of the first layer and the third layer can be terminated with chemically stable first functional groups by using the above-mentioned precursor gas. It is possible to inhibit the adsorption of at least one selected from the group of an atom and a molecule to Si adsorbed to the surface of the wafer 200, and to inhibit the adsorption of at least one selected from the group of an atom and a molecule to the adsorption site (OH termination) on the surface of the wafer 200 that is located in the vicinity of the first functional group. As a result, it is possible to improve the in-plane thickness uniformity and the step coverage of the first layer and the third layer. The laminated oxide film formed on the wafer 200 can be provided as a film having superior in-plane film thickness uniformity and step coverage.

(c) In steps a1 and b1, the precursor gas is supplied under the condition that the first functional group is not desorbed and the second functional group is desorbed from Si contained in the precursor, and under the condition that Si having a state in which the first functional group is bonded thereto and the second functional group is desorbed therefrom is adsorbed to the surface of the wafer 200. This makes it possible to terminate the outermost surfaces of the first layer and the third layer with chemically stable first functional groups, respectively. As a result, it is possible to improve the in-plane thickness uniformity and the step coverage of the first layer and the third layer. The laminated oxide film formed on the wafer 200 can be provided as a film having superior in-plane film thickness uniformity and step coverage.

(d) In step a1 and step b1, the precursor gas is supplied under the condition that the adsorption of Si, which has a state in which the first functional group is bonded thereto and the second functional group is desorbed therefrom, to the surface of the wafer 200 is more dominant (predominant) than the adsorption of the second functional group, which is desorbed from Si, to the surface of the wafer 200. Thus, the outermost surfaces of the first layer and the third layer can be terminated with chemically stable first functional groups while reducing the amount (concentration) of impurities derived from the second functional group and contained in the first layer and the third layer. As a result, the laminated oxide film formed on the wafer 200 can be provided as a film having excellent processing resistance and superior in-plane film thickness uniformity and step coverage.

(e) In steps a1 and b1, the first functional group bonded to Si adsorbed to the surface of the wafer 200 inhibits the adsorption of at least one selected from the group of an atom and a molecule to Si adsorbed to the surface of the wafer 200, and inhibits the adsorption of at least one selected from the group of an atom and a molecule to the adsorption site (OH termination) on the surface of the wafer 200 that is located in the vicinity of the first functional group. As a result, it is possible to improve the in-plane thickness uniformity and the step coverage of the first layer and the third layer. The laminated oxide film formed on the wafer 200 can be provided as a film having superior in-plane film thickness uniformity and step coverage.

(f) In steps a1 and b1, the first functional group bonded to Si adsorbed to the surface of the wafer 200 is allowed to hold the adsorption sites (OH terminations) on the surface of the wafer 200 that is located in the vicinity of the first functional group. As a result, it is possible to improve the in-plane thickness uniformity and the step coverage of the first layer and the third layer. The laminated oxide film formed on the wafer 200 can be provided as a film having superior in-plane film thickness uniformity and step coverage.

(g) In step a1 and step b1, Si can be adsorbed to the surface of the wafer 200 discontinuously, i.e., so as to have a thickness of less than one atomic layer. As a result, it is possible to improve the in-plane thickness uniformity and the step coverage of the first layer and the third layer. The laminated oxide film formed on the wafer 200 can be provided as a film having superior in-plane film thickness uniformity and step coverage.

(h) In steps a1 and b1, when the supply of the precursor gas is continued until the adsorption reaction (chemical adsorption reaction) of Si to the surface of the wafer 200 is saturated, it is possible to improve the in-plane thickness uniformity and the step coverage of the first layer and the third layer. This is because, in the state where the adsorption reaction of Si on the surface of the wafer 200 is saturated, the layer composed of Si adsorbed to the surface of the wafer 200 becomes a discontinuous layer having a thickness of less than one atomic layer, the adsorption sites (OH terminations) are held in a part of the surface of the wafer 200, and the surface of the wafer 200 is covered with the first functional group. As a result, the laminated oxide film formed on the wafer 200 can be provided as a film having better in-plane film thickness uniformity and step coverage.

(i) In step a2, the O-containing gas is supplied under the processing condition that at least one selected from the group of the third functional group included in the first functional group bonded to Si contained in the first layer and the first functional group bonded to Si is desorbed. In step b2, the O-containing gas and the H-containing gas are supplied under the processing condition that the third functional group included in the first functional group bonded to Si contained in the third layer and the first functional group bonded to Si are desorbed. Thus, adsorption sites can be formed on the outermost surfaces of the first layer and the third layer while reducing the amount (concentration) of impurities derived from the first functional group, the third functional group, and the residues thereof and contained in the first layer and the third layer. As a result, the laminated oxide film formed on the wafer 200 can be provided as a film having excellent processing resistance and superior in-plane film thickness uniformity and step coverage.

(j) When forming the laminated oxide film, if the first SiO film is first formed on the wafer 200 by first performing step A, it is possible to suppress oxidization of the base at that time, i.e., the surface of the wafer 200. Thereafter, by forming the second SiO film while allowing the first-formed first SiO film to act as an oxidization blocking layer, it is possible to suppress oxidization of the base at that time. As a result, it becomes possible to suppress oxidization of the base when forming the laminated oxide film.

Further, when forming the laminated oxide film, if the first SiO film is first formed on the wafer 200 by first performing step A, the excellent characteristics of the first SiO film formed first, i.e., the in-plane film thickness uniformity and the step coverage of the first SiO film formed first can be transferred to the film subsequently formed on the first SiO film. Thus, it is possible to improve the in-plane film thickness uniformity and the step coverage of the laminated oxide film finally formed.

(k) Further, when forming the laminated oxide film, if the second SiO film is formed lastly by lastly performing step B, the outermost surface of the finally-formed laminated oxide film can be formed as the second SiO film having excellent processing resistance. As a result, it is possible to enhance the processing resistance of the outermost surface of the finally-formed laminated oxide film, which makes it possible to improve the processing resistance of the entire laminated oxide film.

Further, when forming the laminated oxide film, if the second SiO film is formed lastly by lastly performing step B, it is possible to enhance the processing resistance by modifying the first SiO film which is the lower layer of the second SiO film, and it is possible to further enhance the processing resistance of the entire laminated oxide film. It can be said that the effect set forth herein are the effects obtained by forming the first SiO film and the second SiO film in this order, i.e., the effects obtained by forming the second SiO film on the first SiO film.

In order to obtain these effects, as in the film-forming sequence shown below, it is preferable to first perform step A and lastly perform step B when forming the laminated oxide film. In the film-forming sequence shown below, each of $n_1$, $n_2$ and $n_3$ indicates an integer of 1 or more.

$$[(\text{precursor gas} \rightarrow \text{O-containing gas}) \times n_1 \rightarrow (\text{precursor gas} \rightarrow \text{O-containing gas+H-containing gas}) \times n_2] \times n_3$$

(1) The effects according to these embodiments may be similarly obtained when using the above-mentioned various precursor gases, when using the above-mentioned various oxidizing agents, and when using the above-mentioned various inert gases.

(4) Modification

The substrate processing sequence according to these embodiments may be changed as described in the following modification.

Modification 1

Figure 7:
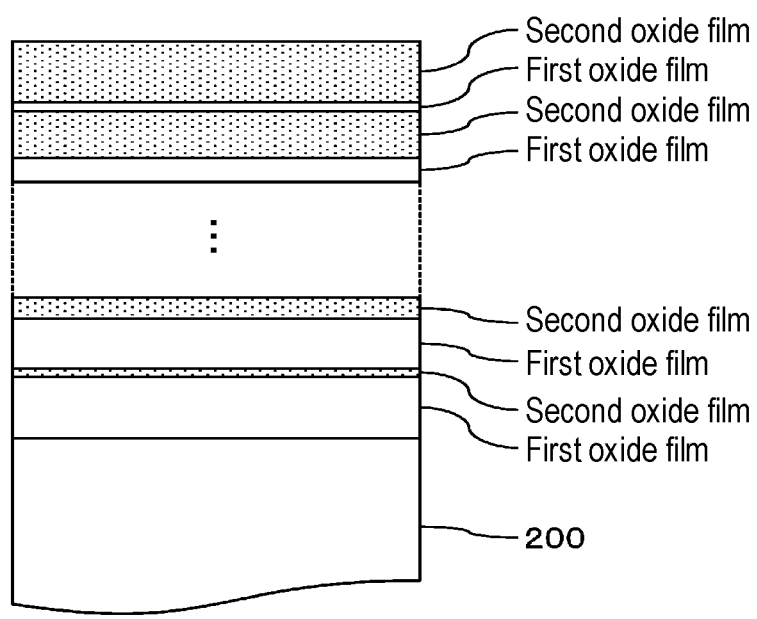
FIG. 7 is an enlarged partial sectional view of the surface of a wafer 200 having a laminated oxide film formed by alternately laminating a first oxide film and a second oxide film in a modification of one or more embodiments of the present disclosure.

As shown in FIG. 7, when forming a laminated oxide film, steps A and B may be alternately repeated, and a first SiO film formed first (initially) may be made thicker than a second SiO film formed first (initially).

According to this modification, the same effects as those of the above-described embodiments may be obtained.

Further, by making the thickness of the first SiO film formed first (initial) thicker than the thickness of the second SiO film formed first (initially), it is possible to suppress oxidization of the base in the first (initial) stage in which oxidization of the base, i.e., the surface of the wafer 200 is likely to occur.

Further, by making the thickness of the first SiO film formed first (initially) thicker than the thickness of the second SiO film formed first (initially), the superior in-plane film thickness uniformity and step coverage of the first SiO film formed first (initially) can be easily transferred to the entire laminated oxide film, and the in-plane film thickness uniformity and step coverage of the finally-formed laminated oxide film can be further improved.

In this case, if the first SiO film having superior in-plane film thickness uniformity and step coverage is first formed, it is possible to further improve the in-plane film thickness uniformity and step coverage of the finally-formed laminated oxide film.

Modification 2

As shown in FIG. 7, when forming a laminated oxide film, steps A and B may be alternately repeated, and a second SiO film formed finally (lastly) may be made thicker than a first SiO film formed finally (lastly).

According to this modification, the same effects as those of the above-described embodiments may be obtained.

Further, by making the thickness of the second SiO film formed finally (lastly) larger than the thickness of the first SiO film formed finally (lastly), it is possible to enhance the processing resistance of the outermost surface of the finally-formed laminated oxide film, and to enhance the processing resistance of the entire laminated oxide film.

In this case, if the second SiO film having excellent processing resistance is finally formed, it is possible to further improve the processing resistance of the finally-formed laminated oxide film.

Modification 3

As shown in FIG. 7, when forming a laminated oxide film, as steps A and B are alternately repeated, the ratio of the thickness of a first SiO film to the thickness of a second SiO film may be gradually reduced. That is, the ratio of the thickness of the second SiO film to the thickness of the first SiO film may be gradually increased.

According to this modification, the same effects as those of the above-described embodiments may be obtained.

Further, it is possible to apply a gradation so that the characteristics of the film is not changed suddenly but is changed gradually in the thickness direction of the laminated oxide film. The respective effects set forth in the above-described embodiments and modifications can be obtained in a well-balanced manner in the entire laminated oxide film. By applying such a gradation in the thickness direction of the laminated oxide film, the act of improving the in-plane film thickness uniformity and the step coverage becomes stronger at the initial stage of film formation while suppressing the oxidization of the base. The act of enhancing the processing resistance becomes stronger in the final stage of film formation. That is, the oxidization of the base of the laminated oxide film is suppressed, the lower portion of the laminated oxide film has characteristics which are excellent particularly in the in-plane film thickness uniformity and the step coverage, and the upper portion of the laminated oxide film has characteristics which are excellent particularly in the processing resistance. Since the upper portion of the laminated oxide film tends to inherit the characteristics of the lower portion of the laminated oxide film (the oxide film formed initially), the in-plane film thickness uniformity and the step coverage of the entire laminated oxide film are also good.

Modification 4

As in the gas supply sequence shown below, when forming a laminated oxide film, an O-containing gas may be supplied to the wafer 200 in advance (pre-flow), and then steps A and B may be alternately performed a predetermined number of times.

$$\text{O-containing gas} \rightarrow (\text{precursor gas} \rightarrow \text{O-containing gas}) \times n_1 \rightarrow (\text{precursor gas} \rightarrow \text{O-containing gas+H-containing gas}) \times n_2 \rightarrow \ldots$$

According to this modification, the same effects as those of the above-described embodiments may be obtained.

Further, by performing the pre-flow of the O-containing gas to the wafer 200, it is possible to optimize the adsorption sites (OH terminations) on the surface of the wafer 200 before forming the laminated oxide film. This makes it possible to promote the formation of the first SiO film or the second SiO film and to shorten the incubation time when forming the laminated oxide film. The processing conditions at this time may be the same as the processing conditions in step a2. However, the O-containing gas supply time is preferably longer than the O-containing gas supply time in step a2. For example, the O-containing gas supply time during the pre-flow of the O-containing gas may be set to 30 to 300 seconds, preferably 60 to 180 seconds.

Other Embodiments of the Present Disclosure

The embodiments of the present disclosure have been specifically described above. However, the present disclosure is not limited to the above-described embodiments, and various modifications may be made without departing from the spirit thereof.

For example, in at least one selected from the group of step A of forming the first SiO film and step B of forming the second SiO film, a step of supplying a N- and H-containing gas such as an ammonia ($NH_3$) gas or the like to the wafer 200 may be performed. The N- and H-containing gas is both a N-containing gas and a H-containing gas. The N- and H-containing gas may be supplied from the above-described H-containing gas supply system. The processing procedure and the processing conditions in the step of supplying the N- and H-containing gas may be the same as those in steps a2 and b2 according to the above-described embodiments.

In this case, on the wafer 200, it may be possible to form: a N-containing SiO film obtained by alternately laminating a N-containing first SiO film and a N-containing second SiO film; a N-containing SiO film obtained by alternately laminating a N-containing first SiO film and a second SiO film; or a N-containing SiO film obtained by alternately laminating a first SiO film and a N-containing second SiO film. In any case, the same effects as those of the above-described embodiments may be obtained.

Further, for example, in at least one selected from the group of step A of forming the first SiO film and step B of forming the second SiO film, a step of supplying a C- and H-containing gas such as a propene ($C_3H_6$) gas or the like to the wafer 200 may be performed. The C- and H-containing gas is both a C-containing gas and a H-containing gas. The C- and H-containing gas may be supplied from the above-described precursor gas supply system. The processing procedure and the processing conditions in the step of supplying the C- and H-containing gas may be the same as those in steps a2 and b2 according to the above-described embodiments.

In this case, on the wafer 200, it may be possible to form: a C-containing SiO film obtained by alternately laminating a C-containing first SiO film and a C-containing second SiO film; a C-containing SiO film obtained by alternately laminating a C-containing first SiO film and a second SiO film; or a C-containing SiO film obtained by alternately laminating a first SiO film and a C-containing second SiO film. In any case, the same effects as those of the above-described embodiments may be obtained.

For example, in at least one selected from the group of step A of forming the first SiO film and step B of forming the second SiO film, a step of supplying a C- and H-containing gas such as a $C_3H_6$ gas or the like to the wafer 200 and a step of supplying a N- and H-containing gas such as an $NH_3$ gas or the like to the wafer 200 may be performed. The C- and H-containing gas may be supplied from the above-described precursor gas supply system, and the N- and H-containing gas may be supplied from the above-described H-containing gas supply system. The processing procedure and the processing conditions in the step of supplying the C- and H-containing gas and the step of supplying the N- and H-containing gas may be the same as those in steps a2 and b2 according to the above-described embodiments.

In this case, on the wafer 200, it may be possible to form: a C- and N-containing SiO film obtained by alternately laminating a C- and N-containing first SiO film and a C- and N-containing second SiO film; a C- and N-containing SiO film obtained by alternately laminating a C- and N-containing first SiO film and a second SiO film; or a C- and N-containing SiO film obtained by alternately laminating a first SiO film and a C- and N-containing second SiO film. In any case, the same effects as those of the above-described embodiments may be obtained.

Further, for example, in at least one selected from the group of step A of forming the first SiO film and step B of forming the second SiO film, a step of supplying a B-containing gas such as a trichloroborane ($BCl_3$) gas or the like to the wafer 200 may be performed. The B-containing gas may be supplied from the above-described precursor gas supply system. The processing procedure and the processing conditions in the step of supplying the B-containing gas may be the same as those in steps a2 and b2 according to the above-described embodiments.

In this case, on the wafer 200, it may be possible to form: a B-containing SiO film obtained by alternately laminating a B-containing first SiO film and a B-containing second SiO film; a B-containing SiO film obtained by alternately laminating a B-containing first SiO film and a second SiO film; or a B-containing SiO film obtained by alternately laminating a first SiO film and a B-containing second SiO film. In any case, the same effects as those of the above-described embodiments may be obtained.

The atom X contained in the precursor gas may be a metal element such as aluminum (Al), titanium (Ti), zirconium (Zr), hafnium (Hf), tantalum (Ta), molybdenum (Mo), tungsten (W), ruthenium (Ru), or the like. In these cases, on the wafer 200, it may be possible to form a laminated metal oxide film such as an aluminum oxide film (AlO film), a titanium oxide film (TiO film), a zirconium oxide film (ZrO film), a hafnium oxide film (HfO film), a tantalum oxide film (TaO film), a molybdenum oxide film (MoO film), a tungsten oxide film (WO film), a ruthenium oxide film (RuO film), or the like. The processing procedure and the processing conditions in these cases may be the same as those in the above-described embodiments. In these cases as well, the same effects as those set forth above may be obtained.

It is preferable that the recipe used for each process are prepared separately according to the processing contents and are stored in the memory device 121c via an electric communication line or an external memory device 123. When starting each process, it is preferable that the CPU 121a properly selects an appropriate recipe from a plurality of recipes stored in the memory device 121c according to the contents of the process. This makes it possible to form films of various film types, composition ratios, film qualities, and film thicknesses with high reproducibility in one substrate processing apparatus. In addition, the burden on an operator can be reduced, and each process can be quickly started while avoiding operation errors.

The above-described recipes are not limited to the newly-prepared ones, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, the input/output device 122 included in the existing substrate processing apparatus may be operated to directly change the existing recipes already installed in the substrate processing apparatus.

In the above-described embodiments, there has been described an example in which a film is formed by using a batch type substrate processing apparatus for processing a plurality of substrates at a time. The present disclosure is not limited to the above-described embodiments, but may be suitably applied to, for example, a case where a film is formed by using a single-wafer type substrate processing apparatus for processing one or several substrates at a time. Furthermore, in the above-described embodiments, there has been described an example in which a film is formed by using a substrate processing apparatus including a hot wall type process furnace. The present disclosure is not limited to the above-described embodiments, but may also be suitably applied to a case where a film is formed by using a substrate processing apparatus including a cold wall type process furnace.

Even in the case of using these substrate processing apparatuses, each process may be performed under the same processing procedures and processing conditions as those in the above-described embodiments and modifications, and the same effects as those of the above-described embodiments and modifications may be obtained.

In addition, the above-described embodiments and modifications may be used in combination as appropriate. The processing procedures and processing conditions at this time may be the same as, for example, the processing procedures and processing conditions of the above-described embodiments and modifications.

According to the present disclosure in some embodiments, it is possible to provide a technique capable of improving the characteristics of an oxide film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing method comprising:
forming an oxide film in which a first oxide film and a second oxide film are laminated on a substrate by performing:
(a) forming the first oxide film containing an atom X by performing a first cycle $n_1$ times ($n_1$ is an integer of 1 or more), the first cycle including (a1) forming a first layer including a component in which a first functional group is bonded to the atom X by supplying a precursor, which includes a partial structure in which the first functional group and a second functional group are directly bonded to the atom X and has a bonding energy between the first functional group and the atom X higher than a bonding energy between the second functional group and the atom X, to the substrate, and (a2) forming a second layer containing the atom X and oxygen by supplying a first oxidizing agent to the substrate to oxidize the first layer; and
(b) forming the second oxide film containing the atom X by performing a second cycle $n_2$ times ($n_2$ is an integer of 1 or more), the second cycle including (b1) forming a third layer including a component in which the first functional group is bonded to the atom X by supplying the precursor to the substrate, and (b2) forming a fourth layer containing the atom X and oxygen by supplying a second oxidizing agent to the substrate to oxidize the third layer, under a condition that an oxidizing power is higher than an oxidizing power when oxidizing the first layer in (a2).

2. The method of claim 1, wherein the atom X includes four bonds, the first functional group is bonded to each of three bonds of the four bonds of the atom X, and the second functional group is bonded to a remaining one bond of the four bonds of the atom X, and
wherein in (a1) and (b1), the precursor is supplied under a condition that the atom X is adsorbed to a surface of the substrate in a state in which the first functional group is bonded to each of the three bonds of the atom X.

3. The method of claim 1, wherein in (a1) and (b1), the precursor is supplied under a condition that the first functional group is not desorbed and the second functional group is desorbed from the atom X contained in the precursor, and under a condition that the atom X, in a state in which the first functional group is bonded to the atom X and the second functional group is desorbed from the atom X, is adsorbed to a surface of the substrate.

4. The method of claim 3, wherein in (a1) and (b1), the precursor is supplied under a condition that the adsorption of the atom X, in the state in which the first functional group is bonded to the atom X and the second functional group is desorbed from the atom X, to the surface of the substrate is more dominant than the adsorption of the second functional group, which is desorbed from the atom X, to the surface of the substrate.

5. The method of claim 2, wherein in (a1) and (b1), the first functional group bonded to the atom X adsorbed to the surface of the substrate inhibits adsorption of at least one selected from the group of an atom and a molecule to the atom X adsorbed to the surface of the substrate, and inhibits adsorption of at least one selected from the group of an atom and a molecule to an adsorption site on the surface of the substrate that is located in a vicinity of the first functional group.

6. The method of claim 2, wherein in (a1) and (b1), an adsorption site on the surface of the substrate that is located in a vicinity of the first functional group is held by the first functional group bonded to the atom X adsorbed to the surface of the substrate.

7. The method of claim 2, wherein in (a1) and (b1), the atom X is discontinuously adsorbed to the surface of the substrate.

8. The method of claim 2, wherein in (a1) and (b1), the supply of the precursor is continued until adsorption reaction of the atom X to the surface of the substrate is saturated.

9. The method of claim 8, wherein in a state in which the adsorption reaction of the atom X to the surface of the substrate is saturated, a layer composed of the atom X adsorbed to the surface of the substrate has a thickness of less than one atomic layer.

10. The method of claim 8, wherein in a state where the adsorption reaction of the atom X to the surface of the substrate is saturated, an adsorption site is held on a part of the surface of the substrate.

11. The method of claim 8, wherein in a state in which the adsorption reaction of the atom X to the surface of the substrate is saturated, the surface of the substrate is covered with the first functional group.

12. The method of claim 1, wherein in (a2), the first oxidizing agent is supplied under a condition that at least one selected from the group of a third functional group included in the first functional group bonded to the atom X contained in the first layer and the first functional group bonded to the atom X is desorbed, and wherein in (b2), the second oxidizing agent is supplied under a condition that the third functional group included in the first functional group bonded to the atom X contained in the third layer and the first functional group bonded to the atom X are desorbed.

13. The method of claim 1, wherein the first functional group includes an alkoxy group, and wherein the second functional group includes at least one selected from the group of an amino group, an alkyl group, a halogeno group, a hydroxy group, a hydro group, an aryl group, a vinyl group, and a nitro group.

14. The method of claim 1, wherein the first oxidizing agent includes at least one selected from the group of an $O_2$ gas, a NO gas, a $N_2O$ gas, and a $NO_2$ gas, and the second oxidizing agent includes at least one selected from the group of $O_2$ gas+$H_2$ gas, $O_3$ gas+$H_2$ gas, $H_2O_2$ gas+$H_2$ gas, $H_2O$+$H_2$ gas, an $O_3$ gas, a $H_2O_2$ gas, a $H_2O$ gas, and a plasma-excited $O_2$ gas.

15. The method of claim 1, wherein a processing temperature in (a) is set to 550 degrees C. or higher and 700 degrees C. or lower, and wherein a processing temperature in (b) is set to 550 degrees C. or higher and 700 degrees C. or lower.

16. The method of claim 1, wherein in the act of forming the oxide film, the first oxide film is first formed.

17. The method of claim 1, wherein in the act of forming the oxide film, the second oxide film is formed lastly.

18. The method of claim 1, wherein in the act of forming the oxide film, (a) and (b) are alternately repeated such that the first oxide film that is first formed is made thicker than the second oxide film that is first formed.

19. The method of claim 1, wherein in the act of forming the oxide film, (a) and (b) are alternately repeated such that the second oxide film formed lastly is made thicker than the first oxide film formed lastly.

20. The method of claim 18, wherein (a) and (b) are alternately repeated such that a ratio of a thickness of the first oxide film to a thickness of the second oxide film is gradually reduced.

21. A method of manufacturing a semiconductor device comprising the method of claim 1.

22. A processing apparatus, comprising:
a precursor supply system configured to supply a precursor, which includes a partial structure in which a first functional group and a second functional group are directly bonded to an atom X and has a bonding energy between the first functional group and the atom X higher than a bonding energy between the second functional group and the atom X, to a substrate;
a first oxidizing agent supply system configured to supply a first oxidizing agent to the substrate;
a second oxidizing agent supply system configured to supply a second oxidizing agent to the substrate;
a heater configured to heat the substrate; and
a controller configured to be capable of controlling the precursor supply system, the first oxidizing agent supply system, the second oxidizing agent supply system, and the heater so as to perform:
forming an oxide film in which a first oxide film and a second oxide film are laminated on the substrate by performing:
(a) forming the first oxide film containing the atom X by performing a first cycle $n_1$ times ($n_1$ is an integer of 1 or more), the first cycle including (a1) forming a first layer including a component in which the first functional group is bonded to the atom X by supplying the precursor to the substrate, and (a2) forming a second layer containing the atom X and oxygen by supplying the first oxidizing agent to the substrate to oxidize the first layer; and
(b) forming the second oxide film containing the atom X by performing a second cycle $n_2$ times ($n_2$ is an integer of 1 or more), the second cycle including (b1) forming a third layer including a component in which the first functional group is bonded to the atom X by supplying the precursor to the substrate, and (b2) forming a fourth layer containing the atom X and oxygen by supplying the second oxidizing agent to the substrate to oxidize the third layer, under a condition that an oxidizing power is higher than an oxidizing power when oxidizing the first layer in (a2).

23. A non-transitory computer-readable recording medium storing a program that causes, by a computer, a processing apparatus to perform a process comprising:
forming an oxide film in which a first oxide film and a second oxide film are laminated on a substrate by performing:
(a) forming the first oxide film containing an atom X by performing a first cycle $n_1$ times ($n_1$ is an integer of 1 or more), the first cycle including (a1) forming a first layer including a component in which a first functional group is bonded to the atom X by supplying a precursor, which includes a partial structure in which the first functional group and a second functional group are directly bonded to the atom X and has a bonding energy between the first functional group and the atom X higher than a bonding energy between the second functional group and the atom X, to the substrate, and (a2) forming a second layer containing the atom X and oxygen by supplying a first oxidizing agent to the substrate to oxidize the first layer; and
(b) forming the second oxide film containing the atom X by performing a second cycle $n_2$ times ($n_2$ is an integer of 1 or more), the second cycle including (b1) forming a third layer including a component in which the first functional group is bonded to the atom X by supplying the precursor to the substrate, and (b2) forming a fourth layer containing the atom X and oxygen by supplying a second oxidizing agent to the substrate to oxidize the third layer, under a condition that an oxidizing power is higher than an oxidizing power when oxidizing the first layer in (a2).

* * * * *